United States Patent [19]
Moore

[11] Patent Number: 6,006,081
[45] Date of Patent: *Dec. 21, 1999

[54] COMMUNICATIONS RECEIVERS

[75] Inventor: Paul A. Moore, Seaford, United Kingdom

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/593,954

[22] Filed: Jan. 30, 1996

[30] Foreign Application Priority Data

Feb. 16, 1995 [GB] United Kingdom ................... 9503064

[51] Int. Cl.⁶ ........................................................ H04B 1/26
[52] U.S. Cl. ........................... 455/326; 455/305; 455/295
[58] Field of Search ...................... 455/304–305, 455/324, 295, 314–315, 303, 326; 257/296, 299, 312, 379, 532–535; 333/24, 26

[56] References Cited

U.S. PATENT DOCUMENTS

| | | | |
|---|---|---|---|
| 4,953,010 | 8/1990 | Cowley | 358/35 |
| 4,972,275 | 11/1990 | Spitz et al. | 360/55 |
| 5,003,621 | 3/1991 | Gailus | 455/209 |
| 5,034,994 | 7/1991 | Muterspaugh et al. | 455/326 |
| 5,187,809 | 2/1993 | Rich et al. | 455/324 |
| 5,208,597 | 5/1993 | Early et al. | 257/532 |
| 5,260,671 | 11/1993 | Iso et al. | 329/302 |
| 5,396,656 | 3/1995 | Jasper et al. | 455/295 |
| 5,548,840 | 8/1996 | Heck | 455/326 |
| 5,570,036 | 10/1996 | Vagher | 455/295 |
| 5,604,746 | 2/1997 | Oto | 455/324 |
| 5,613,233 | 3/1997 | Vagher | 455/296 |
| 5,630,228 | 5/1997 | Mittel | 455/326 |
| 5,809,410 | 9/1998 | Stuebing et al. | 455/333 |

*Primary Examiner*—Andrew I. Faile
*Assistant Examiner*—Vincent F. Boccio
*Attorney, Agent, or Firm*—Jack D. Slobod

[57] ABSTRACT

A communications receiver such as an integrated zero IF receiver comprises an input for receiving an input signal and a zero IF frequency down conversion circuit coupled said input and constructed to provide quadrature related signals (I,Q) at a substantially zero intermediate frequency. In order to balance the signal paths, at least one capacitance in each of the quadrature related zero IF signal paths of the frequency down conversion circuit comprises at least two integrated capacitors connected in anti-parallel. By fabricating the integrated capacitances in this way the symmetry of the circuit is maintained which enhances significantly the second-order inter-modulation performance.

9 Claims, 2 Drawing Sheets

COMMUNICATIONS RECEIVERS

BACKGROUND OF THE INVENTION

The present invention relates to communications receivers, particularly but not exclusively, to zero IF receivers which may be fabricated as integrated circuits. In the present specification "zero IF" or "zero intermediate frequency" is to be interpreted as covering low IF frequencies as well as zero IF.

An advantage of zero IF receivers is that they can be implemented as integrated circuits having very few off-chip components. However, one of the most serious limitations preventing the wider application of such receivers is direct detection caused by inadequate second-order inter-modulation performance. This inadequate second-order inter-modulation performance allows strong input signals occurring anywhere within the bandwidth of the front end of the receiver to effectively bypass all the discrimination which would otherwise be provided by the adjacent channel selectivity filters at the intermediate frequency.

SUMMARY OF THE INVENTION

It is an object of the present invention to improve the second-order inter-modulation performance of a communications receiver.

According to one aspect of the present invention there is provided a communications receiver having means for frequency down-converting a signal to an intermediate frequency, wherein at least one output path from said means is balanced.

According to another aspect of the present invention there is provided a communications receiver fabricated as an integrated circuit, comprising means for frequency down-converting a signal to an intermediate frequency, said means having at least one output, low pass filtering means coupled to said at least one output, and balancing means for making said at least one output substantially symmetrical.

According to a further aspect of the present invention there is provided a zero IF receiver comprising an input for receiving an input signal and frequency down conversion means coupled to said input and constructed to provide quadrature related signals at substantially zero intermediate frequency, wherein each of the quadrature related output paths of the frequency down conversion means is balanced.

The at least one output of the frequency down conversion means may be balanced by providing at least two capacitances connected in anti-parallel. The at least two capacitances may be integrated and may be of substantially equal value.

It has been found that when implementing a capacitance in the output path as pair of integrated capacitors connected in anti-parallel, balanced circuitry exists throughout the receiver and the second-order inter-modulation distortion previously generated by asymmetrical and non-linear stray capacitance to substrate can be substantially eliminated at negligible cost. This results in improving the second-order inter-modulation performance by a substantial margin.

BRIEF DESCRIPTION OF THE DRAWINGS

The present invention will now be described, by way of example, with reference to the accompanying drawings, wherein.

In the drawings the same reference numerals have been used to indicate corresponding features.

DETAILED DESCRIPTION OF THE PREFERRED EMBODIMENTS

Figure 1:
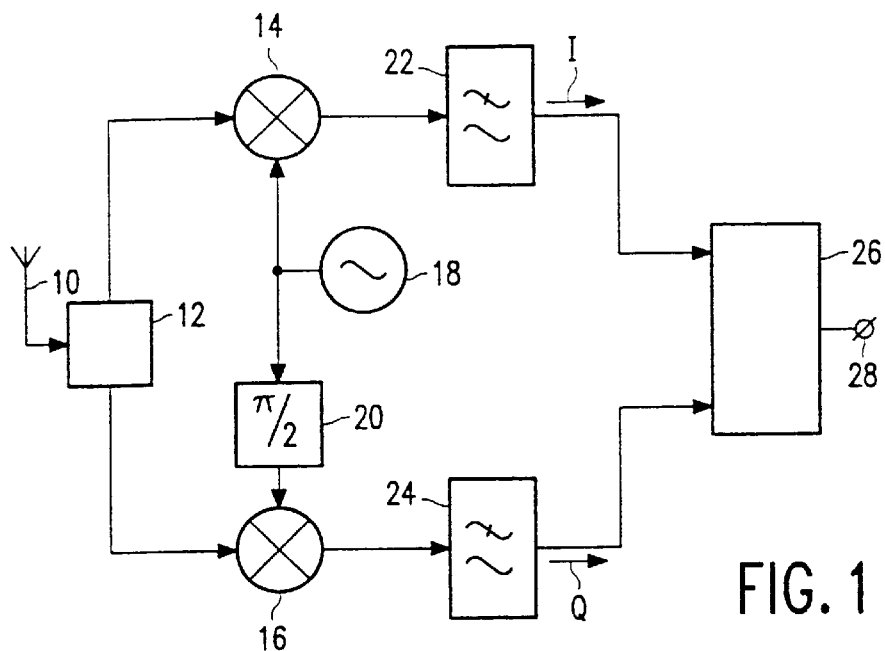
FIG. 1 is a block schematic diagram of one embodiment of a zero IF receiver.

Referring to FIG. 1 an input signal received at an antenna 10 is supplied to a signal splitter 12 which has a pair of outputs connected to first and second mixers 14, 16, respectively. A local oscillator signal source 18 is coupled directly to a second input of the mixer 14, and by way of a 90° phase shifter 20, to a second input of the mixer 16. The frequency of the source 18 normally corresponds to the nominal centre of the frequency spectrum of the input signal. The products of mixing from the mixer 14 are applied to a lowpass filter 22 which selects an in-phase difference signal I which is forwarded to a demodulator 26. The products of mixing from the mixer 16 are applied to a low-pass filter 24 which selects a quadrature related difference signal Q and forwards it to the demodulator 26. The demodulator recovers the original modulation and supplies it to an output 28.

Figure 2:
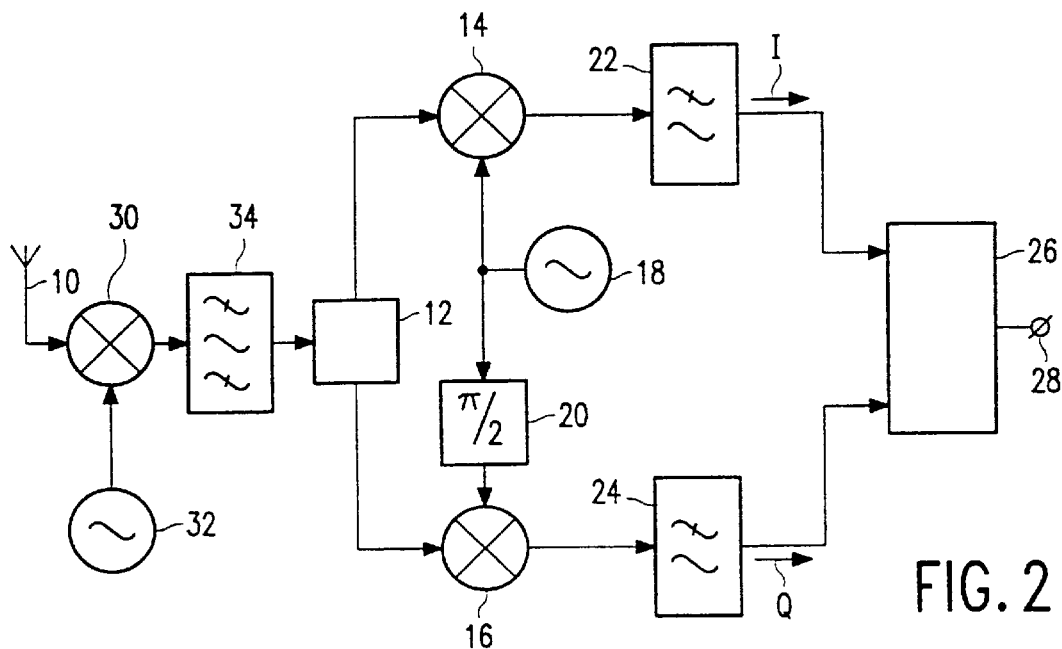
FIG. 2 is a block schematic diagram of a second embodiment of a zero IF receiver.

The second embodiment of the zero IF receiver shown in FIG. 2 of the accompanying drawings differs from that shown in FIG. 1 by the signal received at the antenna 10 being frequency down-converted to an intermediate frequency of say 75 MHz in a mixer 30 to which a local oscillator 32 is coupled. A band-pass filter 34 selects the 75 MHz IF and passes it to the signal splitter 12. Thereafter the signal is processed as described with reference to FIG. 1. In this embodiment the frequency of the local oscillator 18 is set at the IF of 75 MHz so that the difference signals from the mixers 14, 16 are at zero IF.

Numerous variants of the circuits shown in FIGS. 1 and 2 are known and these include the signal splitter 12 comprising 90° phase shifting means whereby there is a 90° phase difference between the signals applied to the mixers 14, 16. With such an embodiment the 90° phase shifter 20 is omitted. Other variants include phase shifting the local oscillator 18 signal by plus and minus 45° and supplying one component to the mixer 14 and the other to the mixer 16. A similar thing may be done to the input signal.

Figure 3:
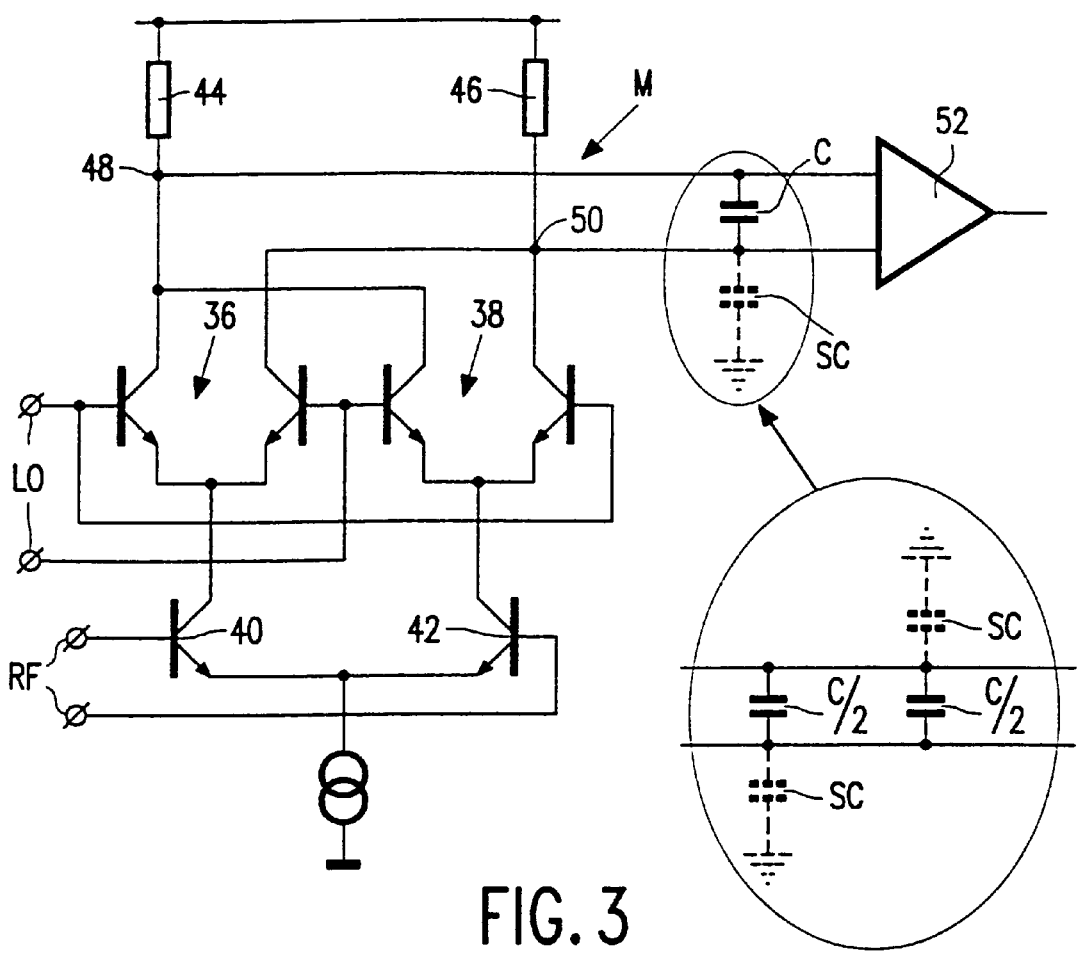
FIG. 3 is schematic circuit diagram of a known type of double balanced transistor tree mixer.

FIG. 3 shows a known type of double balanced transistor tree mixer M. As the mixer is known it will only be described briefly.

The mixer M comprises first and second long tailed pair NPN transistor circuits 36, 38, respectively, whose collector circuits are connected in parallel. A local oscillator LO signal is applied differentially to the first and second long tailed pair circuits 36, 38. A third long tailed pair NPN transistor circuit has the RF (or input) signal applied to the base electrodes of transistors 40, 42. The collectors of the transistors 40, 42 respectively supply the tail current to the first and second circuits 36, 38. Load resistors 44, 46 are provided. The IF signal is developed across these resistors and an output signal is taken differentially from junctions 48, 50 and is supplied to an amplifier 52. Some of the low pass filtering may be realised by a capacitor C connected across the junctions 48, 50. However if the capacitor C is fabricated as a single integrated capacitor, there is a stray capacitance SC, shown in broken lines, to the substrate. The effect of the stray capacitance, which in most cases is non-linear, is to make the otherwise substantially balanced circuit unbalanced.

The presence of this imbalance between the output of the mixers 14, 16 and a point in the low-pass filters 22, 24, which generally are of a distributed nature, gives rise to second-order inter-modulation distortion. This distortion arises due to strong interfering signals being directly detected into the audio band where they are indistinguishable from the wanted IF signal which has been translated into the audio band by the action of the mixers 14, 16. Whilst tuning of the local oscillator 18 can select a wanted RF (or input) signal, the problem with direct detection is that it breaks through irrespective of the tuning of the local oscillator 18 and can not be tuned out.

This problem of second-order inter-modulation distortion can be mitigated significantly by restoring the symmetry, or balance, of the circuitry by replacing the single integrated capacitor C, shown encircled, by two integrated capacitors having half the capacitance, C/2, connected in anti-parallel.

Figure 4:
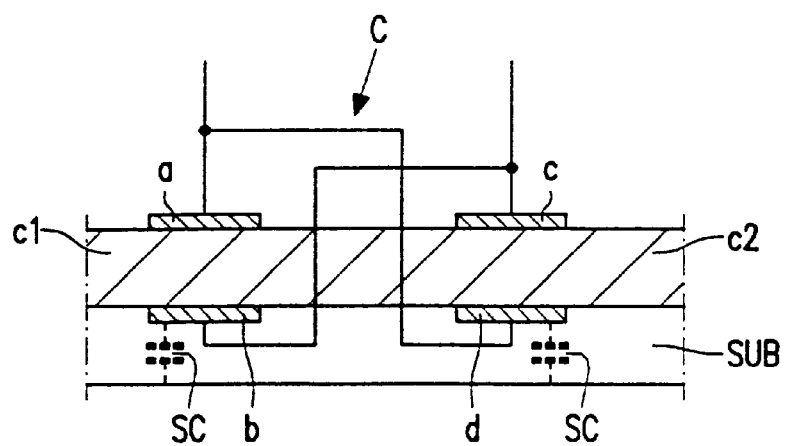
FIG. 4 illustrates diagrammatically a cross-section through an integrated circuit showing a capacitance fabricated by two capacitors connected in anti-parallel.

FIG. 4 shows a capacitance C comprising a capacitor c1 having electrodes a, b and a capacitor c2 having electrodes c, d. Electrodes b and c are interconnected as are the electrodes a and d. As shown in broken lines stray capacitances SC exist between the electrode b and the substrate SUB and between the electrode d and the substrate. These stray capacitances are asymmetrical and usually non-linear but by virtue of the interconnection already described these stray capacitances SC are themselves balanced thereby ensuring that balanced circuitry exists in the signal paths through the zero IF parts of the receiver shown in FIG. 1 or 2.

As is known the capacitance of an integrated capacitor is substantially proportional to its surface area and the division of the capacitor C (FIG. 4) into 2 capacitors c1, c2 having half the capacitance has no significant penalty on chip area.

Although further sub-division of the capacitors c1, c2 is possible it does not confer any benefit electronically but may be of benefit in those applications where an accurate match needs to be maintained between capacitors of widely different values which frequently occurs in low-pass filters.

The problem of integrated dielectric capacitors having asymmetrical stray capacitance to substrate occurs irrespective of the IC process used. In implementing the zero IF receiver made in accordance with the present invention, the QUBiC process was used to make the capacitors.

The present invention relates to a production solution to a problem created by the production process for making integrated capacitors.

Although the present invention has been described and illustrated with reference to zero IF receivers, the present invention may be applied to a balanced output of a mixer which is coupled to distributed filtering means in other types of receivers.

From reading the present disclosure, other modifications will be apparent to persons skilled in the art. Such modifications may involve other features which are already known in the design, manufacture and use of integrated communications receivers and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. An electronic device comprising a balanced circuit for translating the frequency of an input signal, said balanced circuit having first and second output voltages feeding first and second differential inputs, respectively, of a filter, said filter including first and second matched capacitors interconnected in an anti-parallel configuration between the first and second inputs, there being stray capacitances associated with the first and second capacitors, respectively, whereby the stray capacitances associated with the first and second capacitors are balanced thereby mitigating second-order intermodulation distortion which would otherwise be present in the difference between the first and second output voltages.

2. The device of claim 1, wherein the first and second capacitors are fabricated in an integrated circuit including a substrate, and the stray capacitances are to the substrate.

3. The device of claim 1 integrated in an integrated circuit including a substrate, the stray capacitances being to the substrate.

4. The device of claim 1 further comprising distributed low pass filtering means having first and second inputs coupled to said first and second outputs of the balanced circuit for selecting audio frequency signals from said first and second output voltages.

5. A device with a communications receiver comprising:

a balanced mixer for mixing a first input signal with a second input signal, and having first and second outputs for supplying first and second output voltages representative of the mixing; and a filter having differential inputs connected to the first and second outputs and comprising:

first and second matched capacitors connected in an anti-parallel configuration between the first and second outputs, there being stray capacitances associated with the first and second capacitors, respectively, whereby the stray capacitances associated with the first and second capacitors are balanced thereby mitigating a second-order intermodulation distortion which would otherwise be present in the difference between the first and second output voltages.

6. The device of claim 5, wherein the first and second capacitors are fabricated in an integrated circuit including a substrate, and the stray capacitances are to the substrate.

7. The device of claim 5 integrated in an integrated circuit including a substrate, the stray capacitances being to the substrate.

8. The device of claim 5 further comprising distributed low pass filtering means having first and second inputs coupled to said first and second outputs of the balanced mixer for selecting audio frequency signals from said first and second output voltages.

9. A signal processing method comprising forming a differential voltage between a pair of outputs of a balanced circuit for translating the frequency of an input signal, and filtering the differential voltage, the filtering comprising receiving the differential voltage via first and second matched capacitors interconnected in an anti-parallel configuration between the first and second nodes, there being stray capacitances associated with the first and second capacitors, respectively, whereby the stray capacitances associated with the first and second capacitors are balanced thereby mitigating a second-order intermodulation distortion which would otherwise be present in the differential voltage.

* * * * *